United States Patent
Kitani

(10) Patent No.: US 10,720,932 B1
(45) Date of Patent: Jul. 21, 2020

(54) DIGITAL TO ANALOG CONVERTOR, FAILURE BIT NUMBER DETECTOR AND NON-VOLATILE SEMICONDUCTOR STORAGE DEVICE

(71) Applicant: Powerchip Semiconductor Manufacturing Corporation, Hsinchu (TW)

(72) Inventor: Tomofumi Kitani, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/522,684

(22) Filed: Jul. 26, 2019

(30) Foreign Application Priority Data

Mar. 1, 2019 (JP) .................................. 2019-037523

(51) Int. Cl.
  *G11C 7/00* (2006.01)
  *H03M 1/06* (2006.01)
  *G11C 16/34* (2006.01)
  *G11C 16/10* (2006.01)

(52) U.S. Cl.
  CPC ........... *H03M 1/0607* (2013.01); *G11C 16/10* (2013.01); *G11C 16/3459* (2013.01)

(58) Field of Classification Search
  CPC .............................................. G11C 16/3459
  USPC ................................................... 365/189.09
  See application file for complete search history.

(56) References Cited

U.S. PATENT DOCUMENTS

| 6,570,516 B1 | 5/2003 | Barker |
| 2014/0008522 A1* | 1/2014 | Saito .................... H04N 5/3658 250/208.1 |
| 2017/0222859 A1* | 8/2017 | Lehtinen .................. H04B 1/04 |

FOREIGN PATENT DOCUMENTS

| CN | 1322061 | 11/2001 |
| JP | H0630143 | 10/1994 |
| TW | 201423701 | 6/2014 |
| TW | I585368 | 6/2017 |

* cited by examiner

*Primary Examiner* — Hoai V Ho
(74) *Attorney, Agent, or Firm* — JCIPRNET

(57) ABSTRACT

An offset voltage $V_{OFST}$ is compensated in a digital to analog (DA) convertor using a switched-capacitor circuit, including an input circuit, a first differential amplifier, and an offset cancel circuit comprising a second differential amplifier, in a sampling period, when the second feedback circuit is short, an output voltage of the first differential amplifier is input to a first end of a first capacitor, the offset cancel circuit feeds back a reference voltage to an inverting input terminal of the second differential amplifier and a second end of the first capacitor from an output of the second differential amplifier, in a holding period, when the second feedback circuit is not short, the offset cancel circuit inputs a differential voltage between the reference voltage and the output voltage of the first differential amplifier into an inverting input terminal of the first differential amplifier via a second capacitor.

3 Claims, 8 Drawing Sheets

Previous example

DIGITAL TO ANALOG CONVERTOR, FAILURE BIT NUMBER DETECTOR AND NON-VOLATILE SEMICONDUCTOR STORAGE DEVICE

CROSS-REFERENCE TO RELATED APPLICATION

This application claims the priority benefit of Japan application serial no. 2019-037523, filed on Mar. 1, 2019. The entirety of the above-mentioned patent application is hereby incorporated by reference herein and made a part of this specification.

BACKGROUND OF THE INVENTION

1. Field of the Invention

The present invention relates to a digital to analog (DA) (hereinafter, digital to analog conversion is referred to as DA conversion) convertor, used as, for example, a parallel integrated DA convertor, a failure bit number detector that is used in a non-volatile semiconductor storage device and that uses the DA convertor, and a non-volatile semiconductor storage device including the failure bit number detector.

2. Description of Related Art

FIG. 1 is a circuit diagram that represents a structural example of a parallel integrated DA convertor using a switched-capacitor circuit in a previous example. For example, in patent document 1, the DA convertor is disclosed.

In FIG. 1, the DA convertor includes a differential amplifier 1, a feedback circuit 1F, and an input circuit 30. Herein, the differential amplifier is also referred to as an operational amplifier. The feedback circuit 1F is connected between an output terminal and an inverting input terminal of the differential amplifier 1, and contains a switch S1 and a parallel circuit in which a capacitor 5 has a capacitance C10. The input circuit 30 includes n inverters, that is, an inverter 3-1 to an inverter 3-$n$, and n capacitors, that is, a capacitor 4-1 to a capacitor 4-$n$. Herein, the capacitor 4-1 to the capacitor 4-$n$ are input capacitors respectively having a capacitance $C_1$ to capacitance $C_n$.

In the input circuit 30, an input digital voltage $V_{IN1}$ is input into the inverting input terminal of the differential amplifier 1 via the inverter 3-1 and the capacitor 4-1, and an input digital voltage $V_{IN2}$ is input into inverting input terminal of the differential amplifier 1 via the inverter 3-2 and the capacitor 4-2. In the following, similarly, an input digital voltage $V_{INn}$ is input into the inverting input terminal of the differential amplifier 1 via the inverter 3-$n$ and the capacitor 4-$n$. A specified reference voltage VREF is applied to a non-inverting input terminal of the differential amplifier 1.

The DA convertor, composed as above, includes a basic switched-capacitor circuit for use in a digital to analog converter (DAC) and usually has a sampling period and a holding period. In the sampling period, the switch S1 is turned on, and it is assumed that all input digital voltages, that is, the input digital voltage $V_{IN1}$ to the input digital voltage $V_{INn}$, are grounded. In this case, a voltage $V_{m1}$ of the inverting input terminal becomes an output voltage $V_{OUT1}$. Then, the DA convertor turns to the holding period. In the holding period, the switch $S_1$ is turned off, signals DA of all the input digital voltages, that is, the input digital voltage $V_{IN}1$ to the input digital voltage $V_{INn}$ are converted to analog voltages. Herein, the output voltage $V_{OUT1}$ is represented by the following formula.

[Mathematical Formula 1]

$$V_{OUT1} = VREF + \frac{C_1}{C_{10}}V_{IN1} + \frac{C_2}{C_{10}}V_{IN2} + \ldots + \frac{C_n}{C_{10}}V_{INn} \quad (1)$$

$(V_{IN1}, V_{IN2}, \ldots \text{ and } V_{INn} = 0 \text{ or } V_{DD})$

Therefore, when phases of all input capacitances, that is, the input capacitance C1 to the input capacitance Cn are the same, the output voltage $V_{OUT1}$ is represented by the following formula.

[Mathematical Formula 2]

$$V_{OUT1} = VREF + \frac{C_1}{C_{10}}(V_{IN1} + V_{IN2} + \ldots + V_{INn}) \quad (2)$$

$(V_{IN1}, V_{IN2}, \ldots \text{ and } V_{INn} = 0 \text{ or } V_{DD})$

A voltage of a least significant bit (LSB) is represented by the following formula.

[Mathematical Formula 3]

$$V_{LSB} = \frac{C_1}{C_{10}}\nabla_{DD} \quad (3)$$

PRIOR ART DOCUMENT

Patent Document

[Patent document 1] JP Patent Publication No. 6-303143

SUMMARY OF THE INVENTION

The Subject to be Solved by the Invention

FIG. 2 is a chart that represents the concept of bit error in the DA convertor in FIG. 1, and is a chart that represents the output voltage $V_{OUT1}$ relative to a bit count value.

In general, there is an offset voltage $V_{OFST}$ in any differential amplifier. However, a problem does not occur as long as a voltage $V_{LSB}$ of a least significant bit (LSB) is far greater than the offset voltage $V_{OFST}$. In this case, if the input digit n increases, the voltage $V_{LSB}$ of the least significant bit (LSB) becomes smaller. Eventually, the voltage $V_{LSB}$ of the least significant bit (LSB) approaches the offset voltage $V_{OFST}$, or becomes less than the offset voltage $V_{OFST}$. In this case, it means that a bit error has occurred (FIG. 2). Furthermore, the output voltage $V_{OUT1}$ with the offset voltage $V_{OFST}$ is represented by the following formula.

[Mathematical Formula 4]

$$V_{OUT1} = VREF + \frac{C_1}{C_{10}}(V_{IN1} + V_{IN2} + \ldots + V_{INn}) + \nabla_{OFST} \quad (4)$$

In addition, a flash memory has a failure bit detecting function in a program verify action. Originally, the flash memory checks that all programmed bits had been programmed correctly. In order to make the flash memory advanced, several flash memories allow several failure bits in the program verify action. In addition, the flash memory can also use error correction coding (ECC) in the readout action to correct the error bits. Therefore, for the flash memory, it is necessary to provide a failure bit number detector.

The present invention is directed to solving the above problem points, to provide a DA convertor that can compensate the offset voltage $V_{OFST}$ in the DA convertor using the switched-capacitor circuit, a failure bit number detector for detecting a failure bit number of a non-volatile semiconductor storage device by using the DA convertor, and a non-volatile semiconductor storage device including the failure bit number detector.

Means of Solving the Problem

The DA convertor of the present invention includes an input circuit having a plurality of input capacitors relative to a plurality of input digital voltages, and a first differential amplifier having a first feedback circuit, where the DA convertor is a parallel integrated DA convertor for converting the plurality of input digital voltages into analog voltages includes:

an offset cancel circuit comprising a second differential amplifier having a second feedback circuit, where in a sampling period, when the second feedback circuit is short-circuited, an output voltage of the first differential amplifier is input to a first end of a first capacitor, the offset cancel circuit feeds back a reference voltage to an inverting input terminal of the second differential amplifier and a second end of the first capacitor from an output of the second differential, in a holding period, when the second feedback circuit is not short-circuited, the offset cancel circuit inputs a differential voltage between the reference voltage and the output voltage of the first differential amplifier into an inverting input terminal of the first differential amplifier via a second capacitor, such that an offset voltage of the first differential amplifier is compensated regardless of existence of an offset voltage of the second differential amplifier.

Effects of the Invention

Therefore, according to the present invention, a DA convertor that can compensate the offset voltage $V_{OFST}$ in the DA convertor using the switched-capacitor circuit, a failure bit number detector for detecting a failure bit number of a non-volatile semiconductor storage device by using the DA convertor, and a non-volatile semiconductor storage device including the failure bit number detector may be provided.

DESCRIPTION OF THE EMBODIMENTS

The following embodiments of the present invention are described by reference to the accompanying drawings. Furthermore, the same symbol is assigned to the same or identical constituent component.

Embodiment 1

Figure 1:
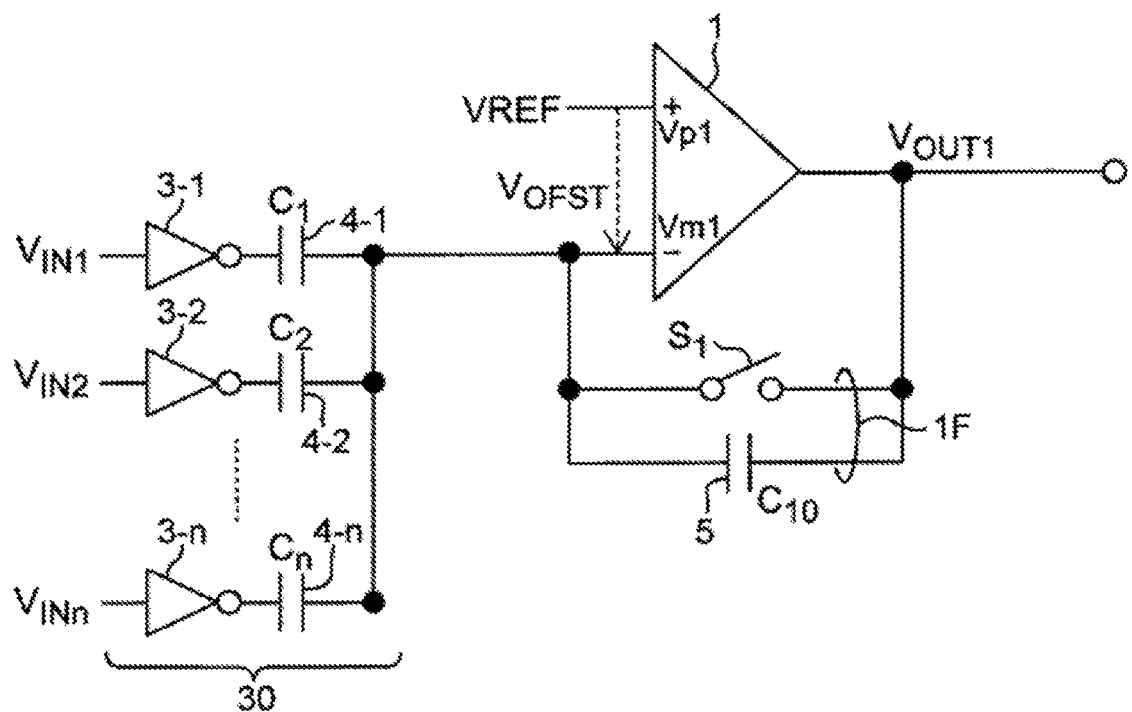
FIG. 1 is a circuit diagram that represents a structural example of a parallel integrated DA convertor of a previous example.
Figure 2:
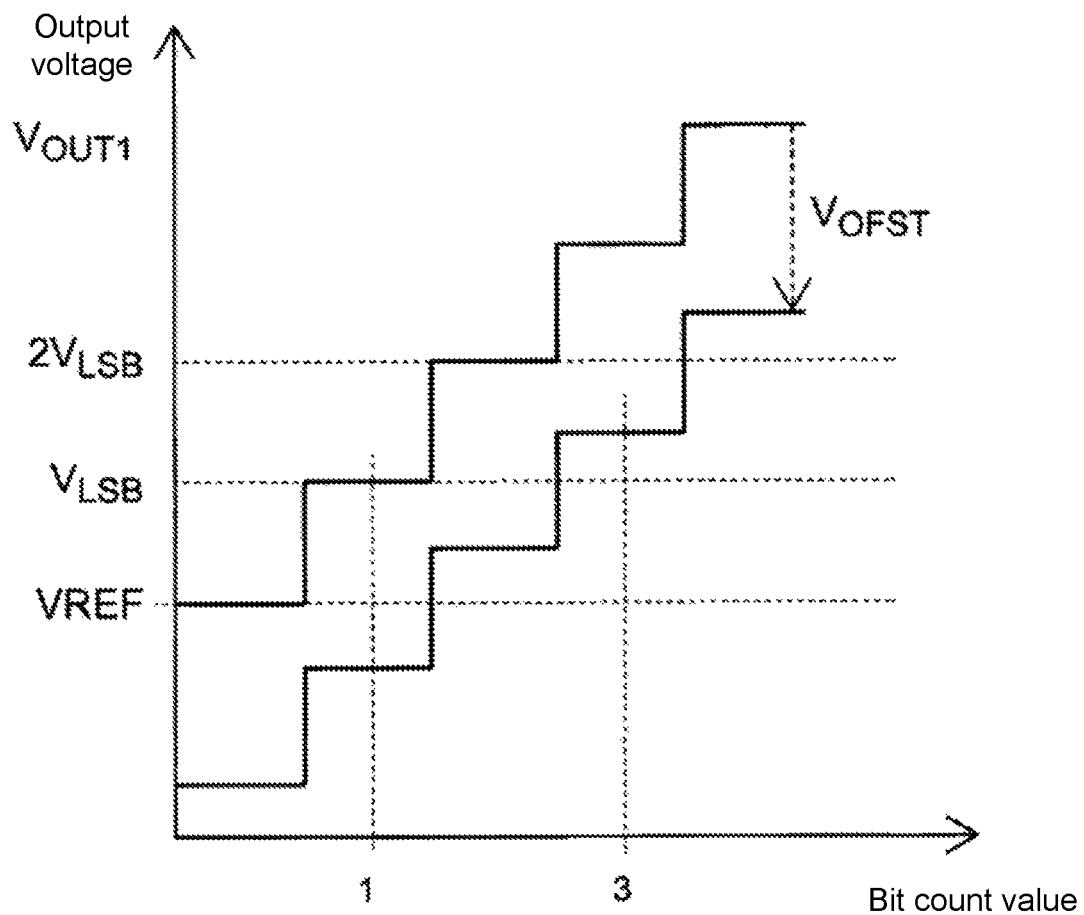
FIG. 2 is a chart that represents a concept of a bit error in the DA convertor in FIG. 1, and a chart that represents an output voltage $V_{OUT1}$ relative to a bit count value.
Figure 3:
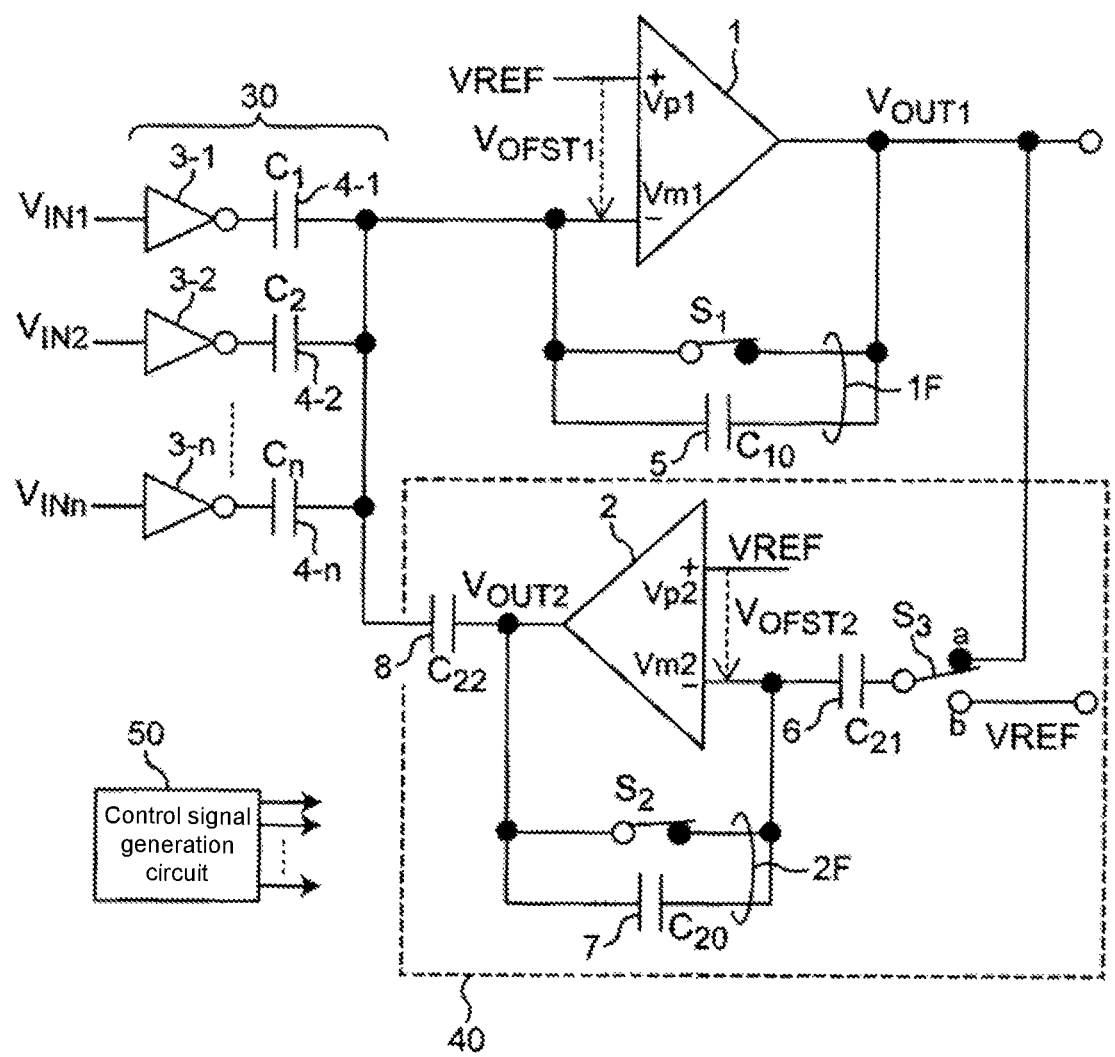
FIG. 3 is a circuit diagram that represents a structural example of a parallel integrated DA convertor of Embodiment 1.

FIG. 3 is a circuit diagram that represents a structural example of a parallel integrated DA convertor of Embodiment 1. Compared with the DA convertor in FIG. 1, the DA convertor in FIG. 3 further includes an offset cancel circuit 40.

In FIG. 3, the offset cancel circuit 40 includes a differential amplifier 2, a feedback circuit 2F, a capacitor 6, and a capacitor 8. The feedback circuit 2F contains a switch $S_2$ and a parallel circuit in which a capacitor 7 has a capacitance $C_{20}$. The capacitor 6 has a capacitance $C_{21}$, and the capacitor 8 has a capacitance $C_{22}$. An output terminal of the differential amplifier 1 is connected to an inverting input terminal of the differential amplifier 2 via a contact a of the switch $S_3$ and the capacitor 6, and the inverting input terminal of the differential amplifier 2 is connected to the output terminal of the differential amplifier 2 via the feedback circuit 2F. The output terminal is connected to the inverting input terminal of the differential amplifier 1 via the capacitor 8. A specified reference voltage VREF is applied to a non-inverting input terminal of the differential amplifier 2, and the reference voltage VREF is applied to the inverting input terminal of the differential amplifier 2 via a contact b of the switch $S_3$ and the capacitor 6. Furthermore, a control signal generation circuit 50 generates a control signal for switching the switch $S_1$ to the switch $S_3$ and outputs the control signal to control terminals of the switch $S_1$ to the switch $S_3$.

Herein, the capacitance $C_{10}$ and the capacitance $C_{22}$ of the capacitor 5 and the capacitor 8 are set to the same value, and the capacitance $C_{21}$ and the capacitance $C_{20}$ of the capacitor 6 and the capacitor 7 are set to the same value. Furthermore, the offset voltage of the differential amplifier 1 is set to $V_{OFST1}$, and the offset voltage of the differential amplifier 2 is set to $V_{OFST2}$.

In this embodiment, the offset voltage $V_{OFST}$ is corrected in the holding period. Therefore, since the input digital voltage $V_{INn}$ is a 1-bit logical signal, the output voltage $V_{OUT1}$ is represented by the following formula.

[Mathematical Formula 5]

$$V_{OUT1} = VREF + \frac{C_1}{C_{10}}(V_{IN1} + V_{IN2} + \ldots + V_{INn}) \quad (5)$$

Figure 4A:
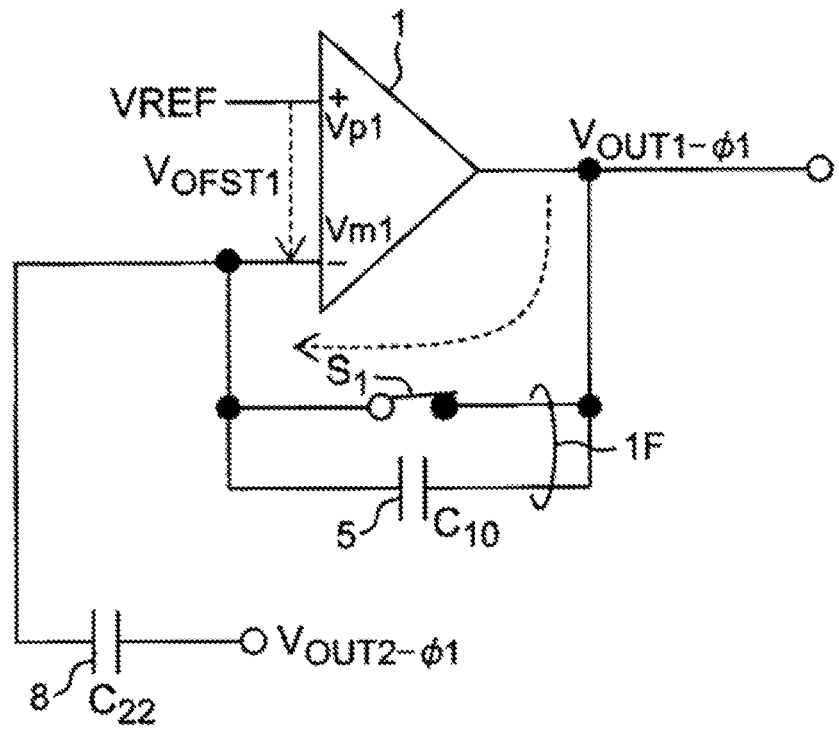
FIG. 4A is a circuit diagram that represents an action of a differential amplifier 1 in FIG. 3 and a peripheral circuit thereof in a sampling period.
Figure 4B:
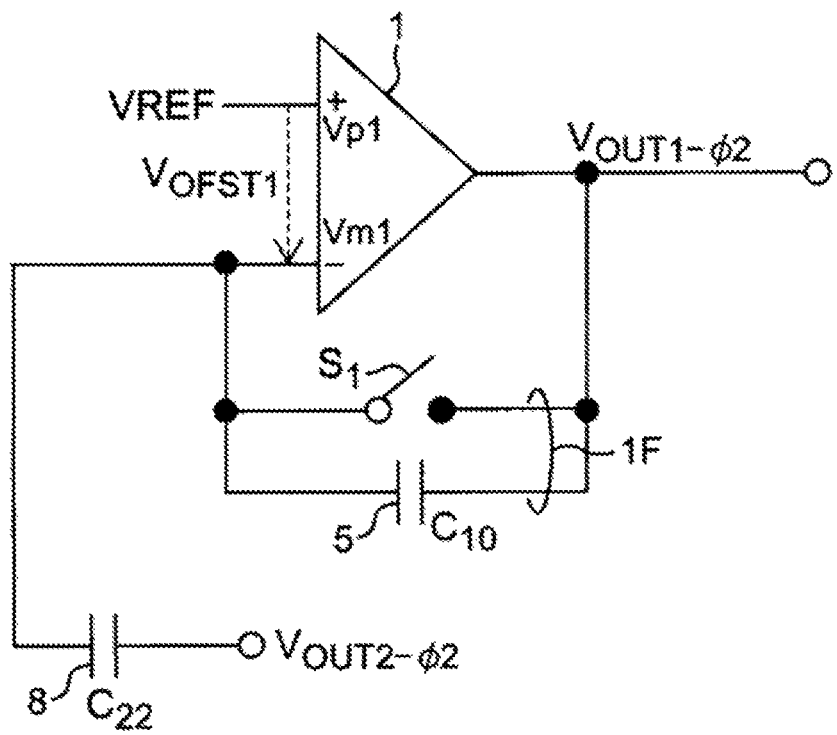
FIG. 4B is a circuit diagram that represents an action of a differential amplifier 1 in FIG. 3 and a peripheral circuit thereof in a holding period.

FIG. 4A is a circuit diagram that represents an action of a differential amplifier 1 in FIG. 3 and a peripheral circuit thereof in a sampling period. In addition, FIG. 4B is a circuit diagram that represents an action of a differential amplifier 1 in FIG. 3 and a peripheral circuit thereof in a holding period. Herein, FIG. 4 A and FIG. 4B represent a method to compensate the offset voltage $V_{OFST1}$.

In the sampling period of FIG. 4A, the switch $S_1$ is turned on, the voltage $V_{OUT1-\phi1}$ is applied to one end of the capacitor 8 via the switch $S_1$, and the voltage $V_{OUT2-\phi1}$ is applied to the other end of the capacitor 8. In this case, the output voltage $V_{OUT1-\phi1}$ is represented by the following formula.

[Mathematical Formula 6]

$$V_{OUT1-\phi1} = VREF + V_{OFST1} \quad (6)$$

Then, in the holding period of FIG. 4B, the switch $S_1$ is turned off. In this case, the voltage $V_{OUT2-\phi1}$ becomes the voltage $V_{OUT2-\phi2}$. Therefore, the voltage $V_{OUT1-\phi2}$ is represented by the following formula.

[Mathematical Formula 7]

$$V_{OUT1-\phi2} = VREF + V_{OFST1} - \frac{C_{22}}{C_{10}}(V_{OUT2-\phi1} - V_{OUT2-\phi2}) \quad (7)$$

Figure 5A:
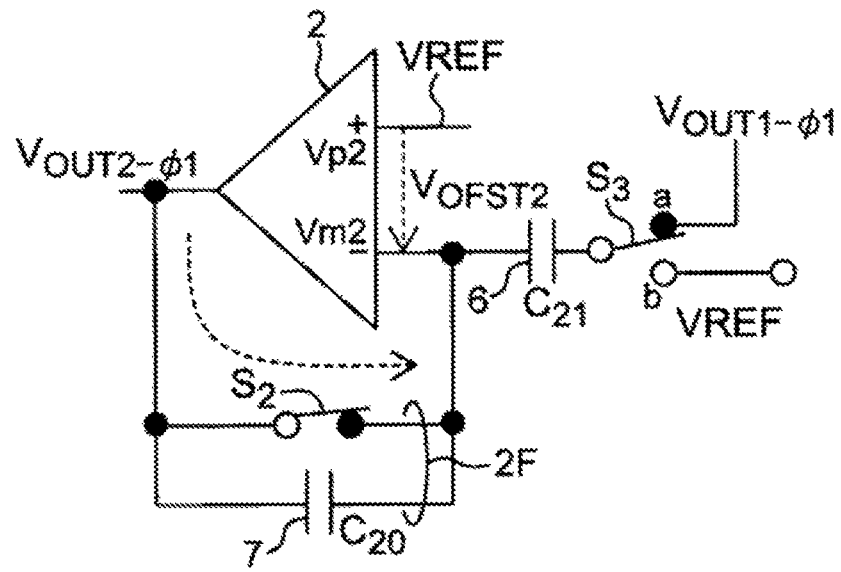
FIG. 5A is a circuit diagram that represents an action of a differential amplifier 2 in FIG. 3 and a peripheral circuit thereof in a sampling period.
Figure 5B:
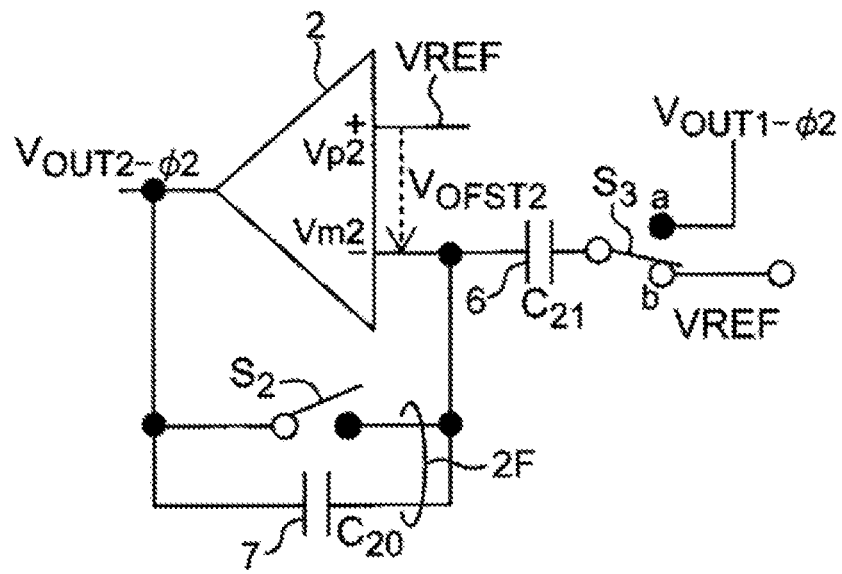
FIG. 5B is a circuit diagram that represents an action of a differential amplifier 2 in FIG. 3 and a peripheral circuit thereof in a holding period.

FIG. 5A is a circuit diagram that represents an action of a differential amplifier 2 in FIG. 3 and a peripheral circuit thereof in a sampling period. In addition, FIG. 5B is a circuit diagram that represents an action of a differential amplifier 2 in FIG. 3 and a peripheral circuit thereof in a holding period. FIG. 5A and FIG. 5B represent detailed actions of the differential amplifier 2.

In the sampling period of FIG. 5A, the switch $S_2$ is turned on, and the switch $S_3$ is switched to the side of the contact a and connected to the voltage $V_{OUT1-\phi1}$. In this case, the voltage $V_{OUT1-\phi1}$ is applied to one end of the capacitor 6, and the voltage $V_{OUT2-\phi1}$ is applied to the other end of the capacitor 6 via the switch $S_2$. In this case, the voltage $V_{OUT2-\phi1}$ is represented by the following formula.

[Mathematical Formula 8]

$$V_{OUT2-\phi1} = VREF + V_{OFST2} \quad (8)$$

Then, in the holding period of FIG. 5B, the switch $S_2$ is turned off, and the switch $S_3$ is switched to the side of the contact b and connected to the reference voltage VREF. In this case, the voltage $V_{OUT2-\phi2}$ is represented by the following formula.

[Mathematical Formula 9]

$$V_{OUT2-\phi2} = VREF + V_{OFST2} - \frac{C_{21}}{C_{20}}(V_{OUT1-\phi1} - VREF) \quad (9)$$

Here, since $C_{21}=C_{20}$, formula (6) is substituted into formula (9), and then the following formula is obtained.

[Mathematical Formula 10]

$$V_{OUT2-\phi2} = VREF + V_{OFST2} - V_{OFST1} \quad (10)$$

Further, since $C_{22}=C_{10}$, formula (8) and (10) are substituted into formula (7), and then the following formula is obtained.

[Mathematical Formula 11]

$$V_{OUT1-\phi2} = VREF \quad (11)$$

As specified in formula (11), there is no offset in the output voltage $V_{OUT1}$ during the holding period. Moreover, the offset voltage $V_{OFST2}$ of the differential amplifier 2 does not affect the action of the differential amplifier 1. In order to correctly feed back the offset voltage $V_{OFST1}$, a condition of $C_{21}=C_{20}$ and $C_{22}=C_{10}$ is required. Therefore, the offset voltage $V_{OFST1}$ of the differential amplifier 1 can be canceled.

As described above, according to the DA convertor in Embodiment 1, a plurality of input digital voltages, that is, the input digital voltage $V_{IN1}$ to the input digital voltage $V_{INn}$ DA is converted into the output voltage $V_{OUT1}$ as analog voltages. Herein, the offset voltage $V_{OFST1}$ of the differential amplifier 1 can be cancelled and compensated by the offset cancel circuit 40 having the differential amplifier 2.

Embodiment 2

Figure 6A:
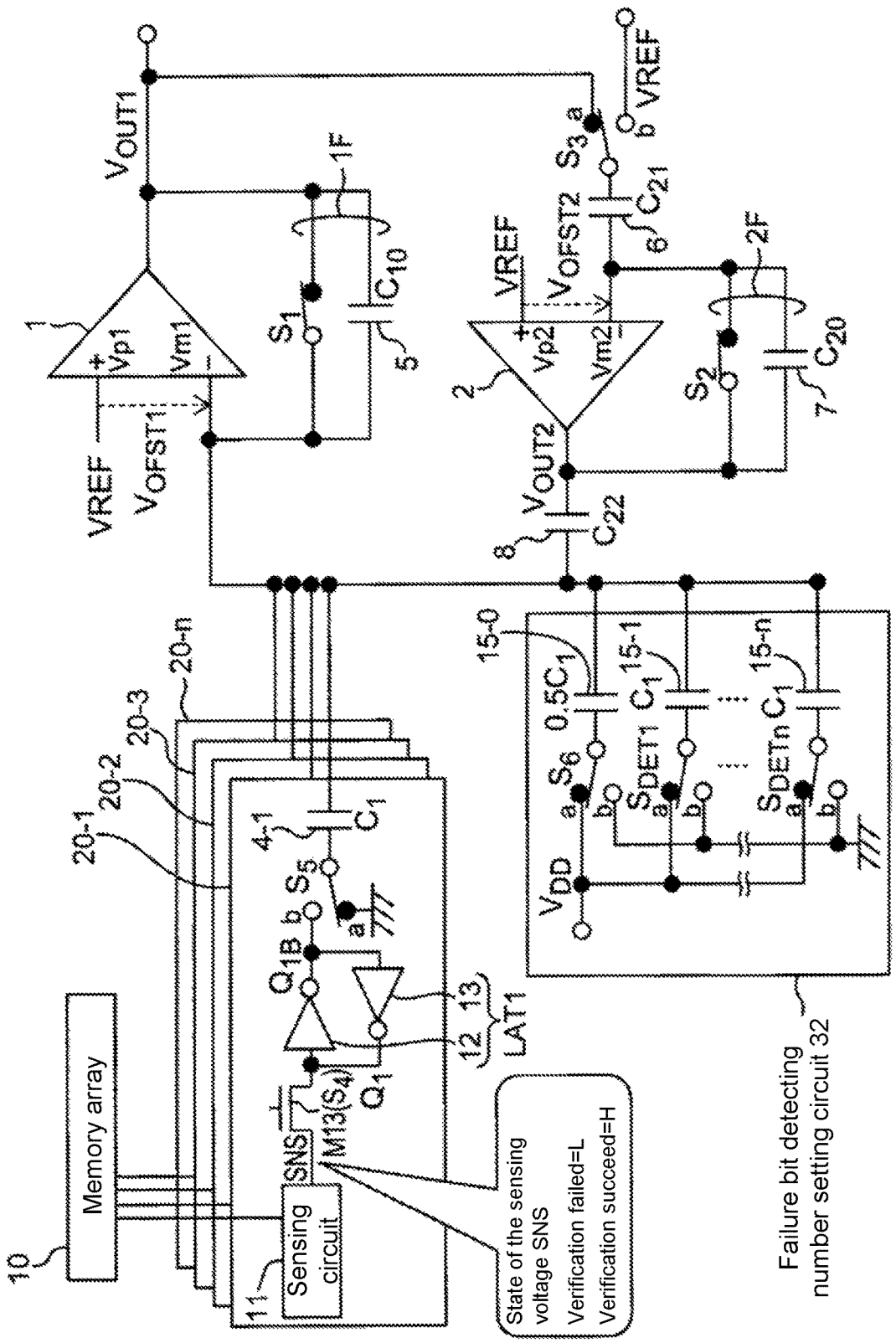
FIG. 6A is a circuit diagram that represents a structural example of a failure bit number detector for a flash memory in Embodiment 2 and is a circuit diagram that represents an action in a sampling period.
Figure 6B:
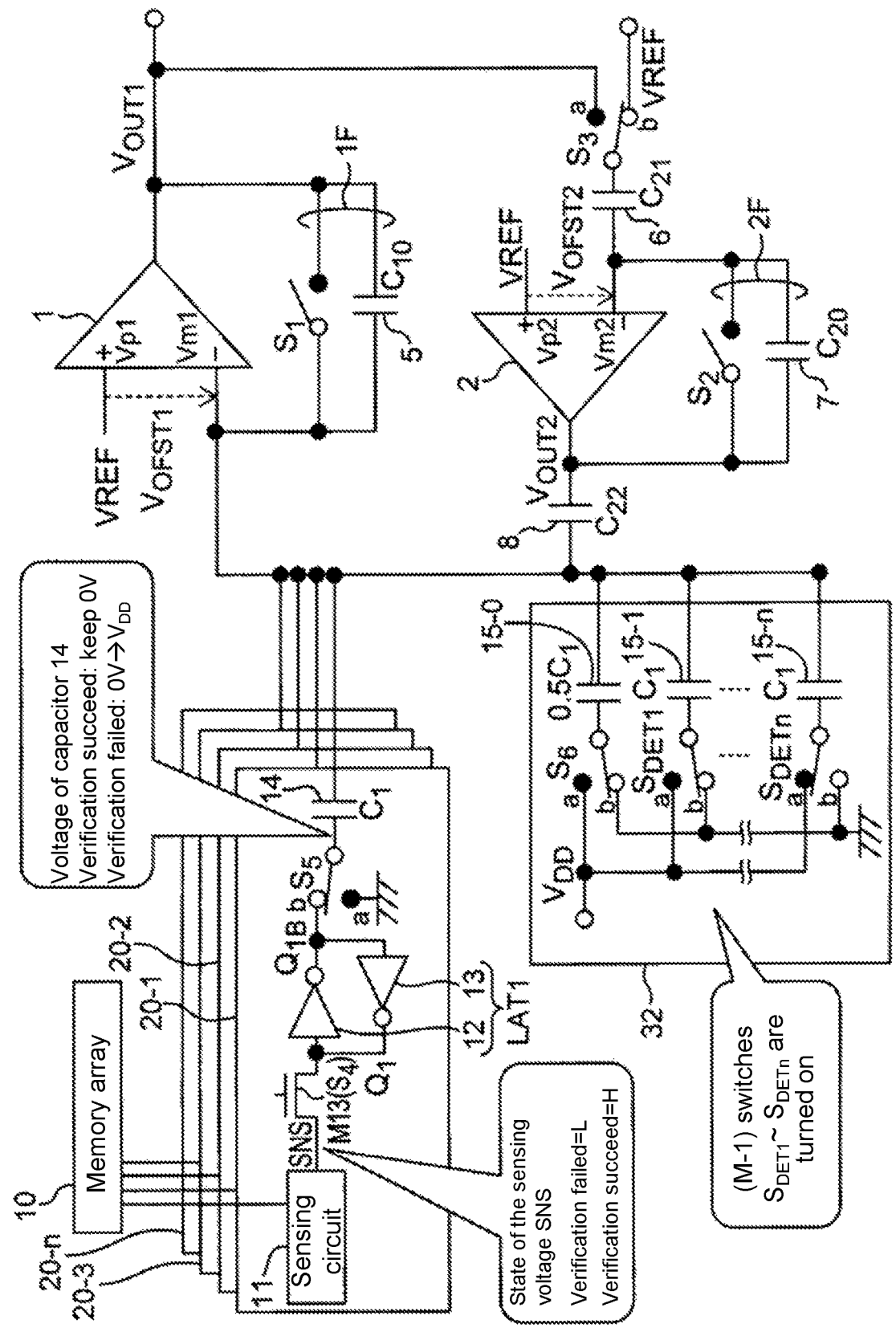
FIG. 6B is a circuit diagram that represents an action of the failure bit number detector in FIG. 6A in a holding period.

FIG. 6A is a circuit diagram that represents a structural example of a failure bit number detector for a flash memory in Embodiment 2 and is a circuit diagram that represents an action in a sampling period. FIG. 6B is a circuit diagram that represents an action of the failure bit number detector in FIG. 6A in a holding period.

Compared with the DA convertor in FIG. 3, the failure bit number detector in FIG. 6A and FIG. 6B is different in the following aspects.

(1) The failure bit number detector is used as the input circuit 30; for example, a page buffer 20-1 to a page buffer 20-n that include flash memories are used to replace the input circuit 30.

(2) The failure bit number detector further includes a failure bit detecting number setting circuit 32 that sets a failure bit detecting number and that is connected to the inverting input terminal of the differential amplifier 1.

The failure bit number detector in FIG. 6A and FIG. 6B is a circuit used to check the degree of the failure bit number (detecting the failure bit number) in the program verify of the flash memory.

In the page buffer 20-1, a sensing circuit 11, connected to a bit line of a memory array 10, detects the bit line voltage and outputs the bit line voltage as a sensing voltage SNS, the sensing voltage SNS is applied to one end of a latch LAT1 via a metal oxide semiconductor (MOS) transistor M13 of the switch $S_4$, and program verify data Q1 is held. Furthermore, when a failure bit is detected, the program verify data Q1 becomes an Low level, and when a failure bit is not detected, the program verify data Q1 becomes an High level (referring to FIG. 6A). The latch LAT1 includes a pair of an inverter 12 and an inverter 13. Inverting data $Q_{1B}$ of the held program verify data Q1 is output to the inverting input terminal of the differential amplifier 1 via the switch $S_5$ and the capacitor 4-1 having the capacitance $C_1$. Herein, in order to convert the inverting data $Q_{1B}$ of the held program verify data $Q_1$ into an analog voltage $V_{OUT1}$ through the DA convertor, the switch $S_5$ and the capacitor 4-1 (a component of a part of the input circuit 30) are set. Further, the page buffer 20-2 to the page buffer 20-n are composed in the same manner as the page buffer 20-1, and the inverting data of the held program verify data is output to the inverting input terminal of the differential amplifier 1.

In the failure bit number detector of FIG. 6A and FIG. 6B, in order to set the failure bit detecting number M, the failure bit detecting number setting circuit 32 is provided. The failure bit detecting number setting circuit 32 includes a switch $S_6$, a switch $S_{DET1}$ to a switch $S_{DETn}$, and a capacitor 15-0 to a capacitor 15-n. Herein, the capacitor 15-0 has a capacitance $0.5C_1$, the other end of the capacitor 15-0 is connected to the source voltage $V_{DD}$ via the contact a of the switch $S_6$, and the contact b of the switch $S_6$ is grounded. In addition, the capacitor 15-1 has a capacitance $C_1$, the other end of the capacitor 15-1 is connected to the source voltage $V_{DD}$ by the contact a of the switching $S_{DET1}$, and the contact b of the switch $S_{DET1}$ is grounded. In the following, similarly, the capacitor 15-n has a capacitance $C_1$, the other end of the capacitor 15-n is connected to the source voltage $V_{DD}$ via the contact a of the switch $S_{DETn}$, and the contact b of the switch $S_{DETn}$ is grounded.

Here, the switch $S_6$ and the capacitor 15-0 are designed to make the output voltage $V_{OUT1}$ of the differential amplifier 1 0.5LSB higher than the reference voltage VREF.

Figures 7, 8:
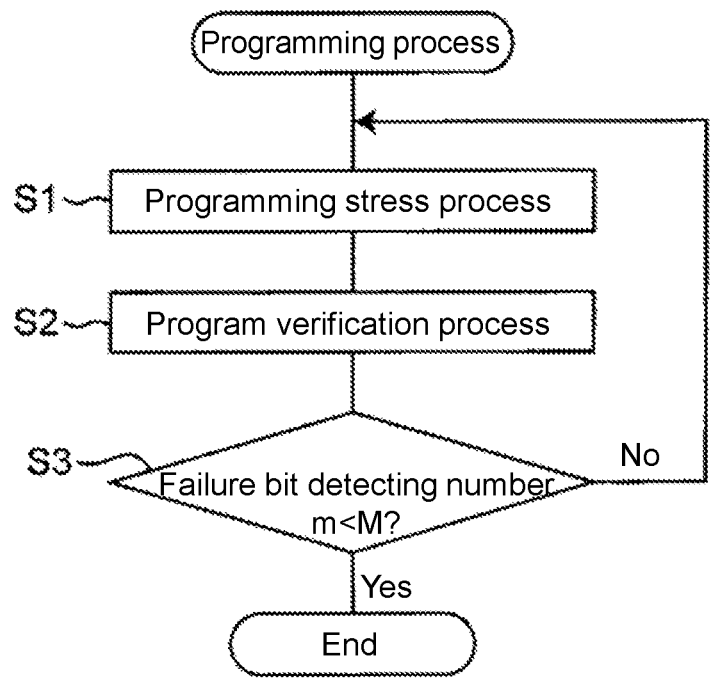
FIG. 7 is a setting table of a relationship between the failure bit detecting numbers and a set number $S_{DETn}$ in the failure bit number detector in FIG. 6A.
FIG. 8 is a flowchart that represents a programming process of a flash memory using the failure bit number detector in FIG. 6A.

FIG. 7 is a setting table of a relationship between the failure bit detecting numbers M and a set number $S_{DETn}$ in the failure bit number detector in FIG. 6A. As specified in FIG. 7, if the failure bit detecting number is set to M, the (M−1) switches $S_{DET1}$ to $S_{DETn}$ are switched to the side of the contact b and are turned on.

If the number of the failure bit m becomes greater than M, then the output voltage $V_{OUT1}$ becomes lower than the reference voltage VREF. The flash memory continues the program operation while the output voltage $V_{OUT1}$ is lower than the reference voltage VREF.

In the sampling period of FIG. 6A, the switch $S_4$ is turned on. The sensing circuit 11 senses the voltage of the bit line from the specified memory unit of the memory array 10, and the program verify data of the sensing voltage SNS is transferred to the latch LAT1 via the switch $S_4$ and is stored. Herein, when the program verify data is an High level, it indicates that verification succeeds; on the other hand, when the program verify data is an Low level, it indicates that verification fails (the number of failure bit m is more than M). Herein, in the DA convertor, the switch $S_1$ and the switch $S_2$ are turned on, the switch $S_3$ is switched to the side of the contact a and connected to the output voltage $V_{OUT1}$. The switch $S_5$ is switched to the side of the contact a and grounded, and the switch $S_6$ is switched to the side of the contact a and connected to the source voltage $V_{DD}$. After it stored the data in the latch LAT1, the DA convertor turns to the holding period.

Then, in the holding period of FIG. 6B, the switch $S_1$ and switch $S_2$ are turned off and the switch $S_3$ is switched to the side of the contact b and connected to the reference voltage VREF. In addition, the switch $S_5$ is switched to the side of the contact b and connected to the other end of the latch LAT1, and the switch $S_6$ is switched to the side of the contact b and grounded. When the program verify data that has been stored in the latch LAT1 is an L level and verification fails, the potential at one end (the side of the latch LAT1) of the capacitor 14 in the page buffer 20-1 to the page buffer 20-n changes from 0 V to the source voltage $V_{DD}$; on the other hand, LAT1 stores High level, the other end is maintained as 0 V. Therefore, when M−1 switches in $S_{DET1}$ to $S_{DETn}$ are set to be turned on, the output voltage $V_{OUT1}$ is represented by the following formula.

[Mathematical Formula 12]

$$V_{OUT1} = VREF + \frac{C_1}{C_{10}}\{(V_{IN1} + V_{IN2+...} + V_{INn}) - 0.5\ V_{DD} - (M-1)V_{DD}\} \quad (12)$$

Furthermore, when the verification has failed, the input digital voltage $V_{INn}$ of the differential amplifier 1 becomes the source voltage $V_{DD}$, and when the verification succeeds, the input digital voltage $V_{INn}$ becomes 0 V.

According to the failure bit number detector as composed in FIG. 6A and FIG. 6B, if the number of failure bit m becomes greater than M, and then the output voltage $V_{OUT1}$ becomes lower than the reference voltage VREF. The flash memory continues the program operation while the output voltage $V_{OUT1}$ is lower than the reference voltage VREF.

FIG. 8 is a flowchart that represents a programming process of a flash memory using the failure bit number detector in FIG. 6A.

In step $S_1$ of FIG. 8, in order to program data into the memory unit, it forces to high-voltage. In step $S_2$ as program verify operation, it verifies if the data is correctly programmed. In step $S_3$, when the number of failure bit m detected by the failure bit number detector in FIG. 6A is more than the M, return to step $S_1$ in order to continue the programming action. On the other hand, in step $S_3$, if the number of failure bit m detected by the failure bit number detector in FIG. 6A is less than the M, the programming process ends.

In the above embodiments, the failure bit number detector for detecting the failure bit number for use in a flash memory is described, but the present invention is not limited thereto, and can be applied to other various non-volatile semiconductor storage devices.

As stated above, according to Embodiment 1 and Embodiment 2, the DA convertor that can compensate the offset voltage $V_{OFST}$ in the DA convertor using the switched-capacitor circuit can be implemented. In addition, the failure bit number detector for detecting the number of failure bit in a non-volatile semiconductor storage device such as a flash memory can be implemented by using the DA convertor. Further, the failure bit number detector may be included to implement the non-volatile semiconductor storage device such as a flash memory.

What is claimed is:

1. A digital to analog (DA) convertor, comprising a switched-capacitor circuit, the switched-capacitor circuit comprises an input circuit having a plurality of input capacitors relative to a plurality of input digital voltages and a first differential amplifier having a first feedback circuit, wherein the DA convertor is a parallel integrated DA convertor for converting the plurality of input digital voltages into analog voltages, and comprises:

an offset cancel circuit comprising a second differential amplifier having a second feedback circuit, wherein in a sampling period, when the second feedback circuit is short, an output voltage of the first differential amplifier is input to a first end of a first capacitor, the offset cancel circuit feeds back a reference voltage to an inverting input terminal of the second differential amplifier and a second end of the first capacitor from an output of the second differential amplifier, in a holding period, when the second feedback circuit is not short, the offset cancel circuit inputs a differential voltage between the reference voltage and the output voltage of the first differential amplifier into an inverting input terminal of the first differential amplifier via a second capacitor, such that an offset voltage of the first differential amplifier is compensated regardless of existence of an offset voltage of the second differential amplifier.

2. A failure bit number detector, comprising the DA convertor according to claim 1, wherein the failure bit number detector is used in a non-volatile semiconductor storage device and comprises:

a failure bit detecting number setting circuit connecting to the inverting input terminal of the first differential amplifier, and sets the number of a plurality of third capacitors performing grounding via the plurality of third capacitors to a failure bit detecting number, wherein when the input circuit fails in verification of each memory unit in a memory array of the non-volatile semiconductor storage device, a specified voltage is input into the inverting input terminal of the first differential amplifier via each of the input capacitors, and when the number of failure bit of the memory unit in the memory array of the non-volatile semiconductor storage device is less than the failure bit detecting number, the output voltage of the first differential amplifier is higher than the reference voltage.

3. A non-volatile semiconductor storage device, comprising the failure bit number detector according to claim 2.

* * * * *